(12) United States Patent
Kuwahara et al.

(10) Patent No.: US 7,614,884 B2
(45) Date of Patent: Nov. 10, 2009

(54) CONNECTOR CONNECTABLE WITH LOW CONTACT PRESSURE

(75) Inventors: Takashi Kuwahara, Tokyo (JP); Seiya Takahashi, Tokyo (JP); Hiroshi Akimoto, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 12/154,297

(22) Filed: May 22, 2008

(65) Prior Publication Data

US 2008/0293306 A1 Nov. 27, 2008

(30) Foreign Application Priority Data

May 23, 2007 (JP) .............................. 2007-136927

(51) Int. Cl.
*H01R 12/00* (2006.01)
(52) U.S. Cl. ............................ 439/66; 439/86; 439/591
(58) Field of Classification Search .................. 439/66, 439/86, 87, 591, 91
See application file for complete search history.

(56) References Cited

U.S. PATENT DOCUMENTS

| 5,118,299 | A |   | 6/1992 | Burns et al. |
| 5,163,834 | A | * | 11/1992 | Chapin et al. ................. 439/66 |
| 5,399,101 | A | * | 3/1995 | Campbell et al. ........... 439/482 |
| 5,420,520 | A | * | 5/1995 | Anschel et al. .............. 324/754 |
| 5,743,749 | A | * | 4/1998 | Kurakane .................... 439/72 |
| 6,002,589 | A | * | 12/1999 | Perino et al. ................ 361/749 |
| 6,618,941 | B2 | * | 9/2003 | Campbell et al. ............. 29/846 |
| 7,011,556 | B2 | * | 3/2006 | Miyazawa et al. .......... 439/886 |
| 7,303,403 | B2 |   | 12/2007 | Kuwahara |
| 2001/0041465 | A1 | * | 11/2001 | Szalay et al. ................. 439/67 |

FOREIGN PATENT DOCUMENTS

| JP | 2103877 | 4/1990 |
| JP | 4262373 | 9/1992 |
| JP | 7014891 | 1/1995 |
| JP | 7211378 | 8/1995 |
| JP | 8 203583 | 8/1996 |
| JP | 9 133711 | 5/1997 |
| JP | 2002 158056 | 5/2002 |
| JP | 2003 185700 | 7/2003 |
| JP | 2006 310140 | 11/2006 |

OTHER PUBLICATIONS

Japanese Office Action dated Feb. 18, 2009, 2 pages.

* cited by examiner

*Primary Examiner*—James Harvey
(74) *Attorney, Agent, or Firm*—Collard & Roe, P.C.

(57) ABSTRACT

For achieving electrical connection by contact with a connection object, a connector includes a body portion including an elastic body. A conductive layer extends along a surface of the body portion and is adapted for contact with the connection object. The conductive layer has a plurality of projections projecting outward.

10 Claims, 5 Drawing Sheets

CONNECTOR CONNECTABLE WITH LOW CONTACT PRESSURE

This application is based upon and claims the benefit of priority from Japanese patent application No. 2007-136927, filed on May 23, 2007, the disclosure of which is incorporated herein in its entirely by reference.

TECHNICAL FIELD

This invention relates to a connector adapted to achieve electrical connection by contact with a connection object.

BACKGROUND ART

Recently, with the miniaturization of electronic products, it has been required that connectors be not only reduced in size, but also increased in the number of contacts. For example, in the case of an LGA (Land Grid Array) connection device, the number of terminals or contacts of a connector sometimes exceeds 5,000. Therefore, in that case, it is desirable that the pitch of the contacts of the connector be narrowed for achieving a reduction in size thereof.

In response to those requirements, various techniques have been developed. For example, Japanese Unexamined Patent Application Publication (JP-A) No. 2006-310140 (hereinafter referred to as "Patent Document 1") discloses a connector comprising an elastic body formed with protruding portions, a film provided on the elastic body so as to cover the protruding portions, and conductor portions disposed on the film at positions corresponding to the protruding portions. This connector can be used for connecting a connection object having an electronic device such as an LSI to a printed wiring board or the like.

Japanese Unexamined Patent Application Publication (JP-A) No. 2002-158056 (hereinafter referred to as "Patent Document 2") discloses an electrical contact member formed with three metal plating layers on the surface of a rigid electrical contact member having springiness. These plating layers include a first plating layer being a composite plating layer containing hard particles, a second plating layer in the form of metal plating of the same kind as composite plating of the first plating layer, formed on the first plating layer and containing no particles, and a third plating layer in the form of metal plating as finishing plating, formed on the second plating layer. This electrical contact member can also be used for connecting a connection object having an electronic device such as an LSI to a printed wiring board or the like.

SUMMARY OF THE INVENTION

Generally, an electronic device generates heat by itself and thus is mounted with a heat sink for improving heat dissipation. Oil like grease is sometimes interposed between the electronic device and the heat sink. The oil tends to flow out due to self-heat generation of the electronic device.

In the case of using the connector described in Patent Document 1, the oil, if it flows out, forms a contamination layer spreading to cover contact portions of the connector. This contamination layer causes unstable connection. This also applies to the case where the connector is used in an environment with a large amount of fibrous dust or in an environment exposed to particles such as $SiO_2$ particles.

In the case of using the electrical contact member described in Patent Document 2, there is a problem that the third plating layer cannot follow the surface of a contact portion upon connection so that the surface of the contact portion and the third plating layer are brought into contact with each other only at several points. In order to achieve a sufficiently low connection resistance between the contact portion and the third plating layer, a large contact force is required for deforming the contact portion and the third plating layer.

It is therefore an exemplary object of this invention to provide a connector that is connectable with low contact pressure.

Other objects of the present invention will become clear as the description proceeds.

According to an exampraly aspect of the present invention, there is provided a connector adapted to achieve electrical connection by contact with a connection object. The connector comprises a body portion comprising an elastic body and a conductive layer extending along a surface of the body portion and adapted for contact with the connection object, wherein the conductive layer has a plurality of projections projecting outward.

DESCRIPTION OF THE EXEMPLARY EMBODIMENTS

Figure 1:
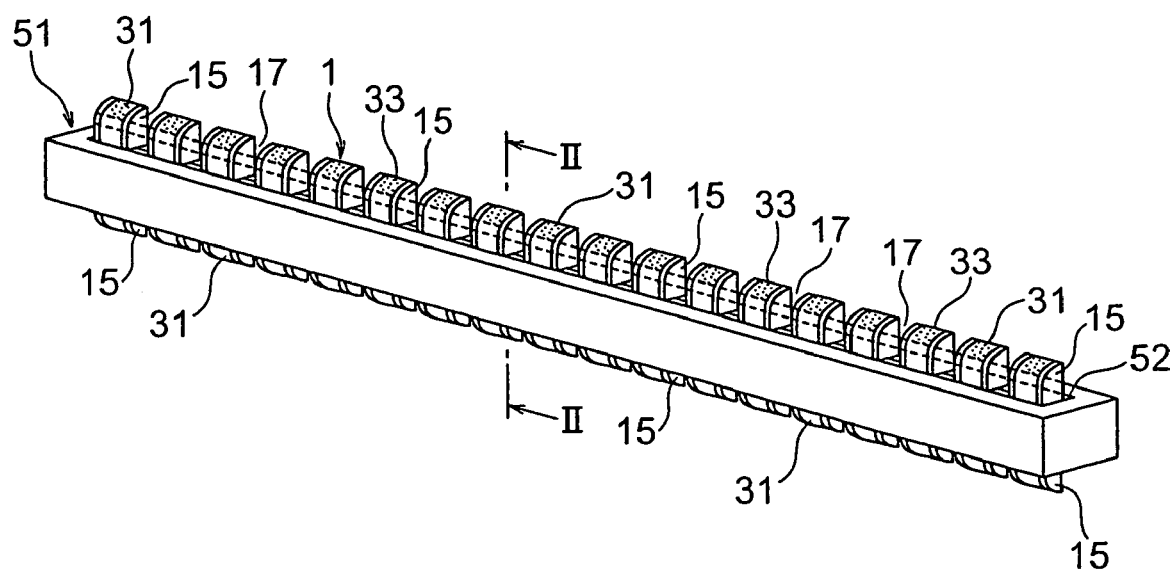
FIG. 1 is a perspective view of a connector according to a first exemplary embodiment of this invention.
Figure 2:
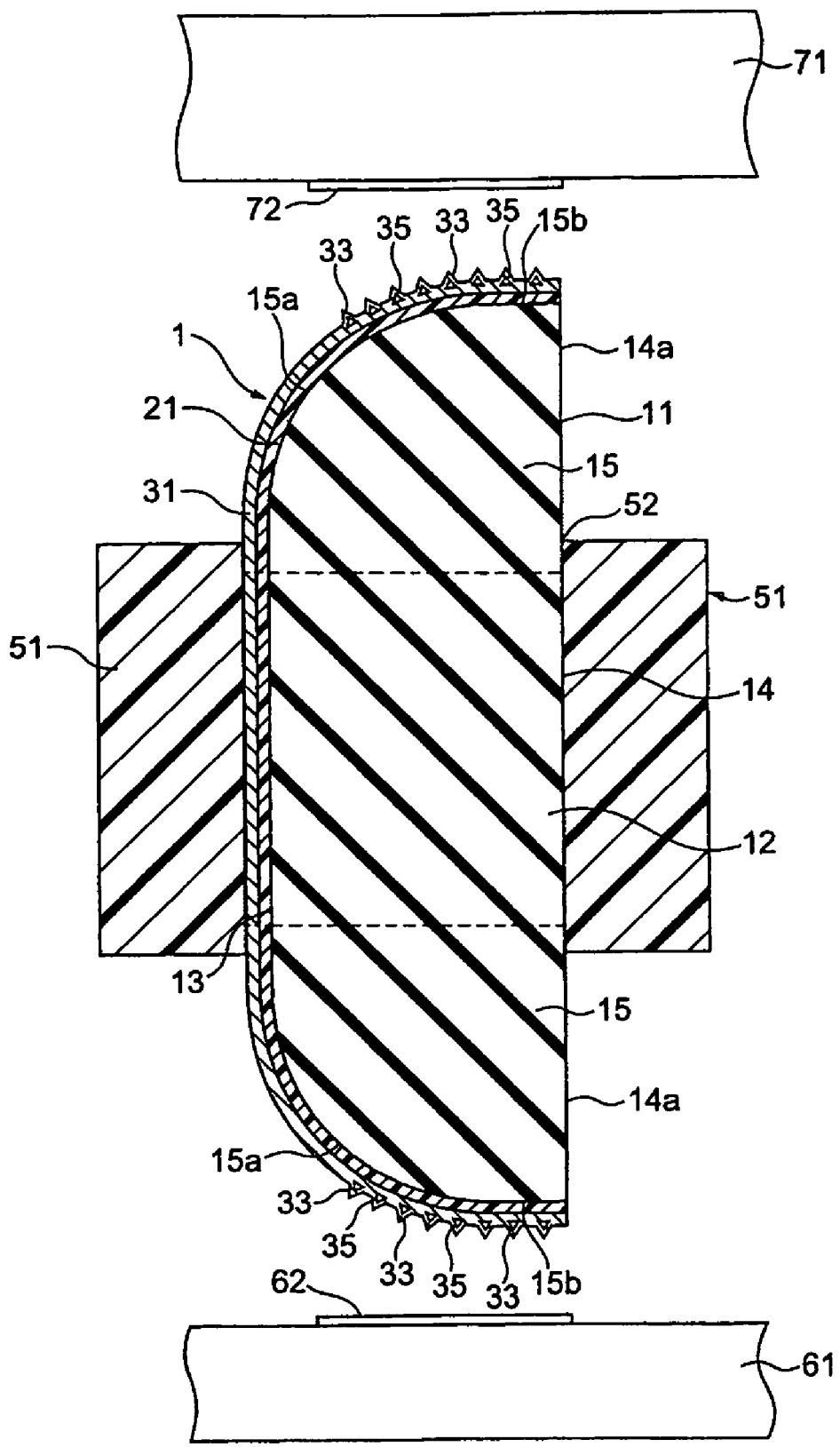
FIG. 2 is a sectional view taken along line II-II in FIG. 1.
Figure 3:
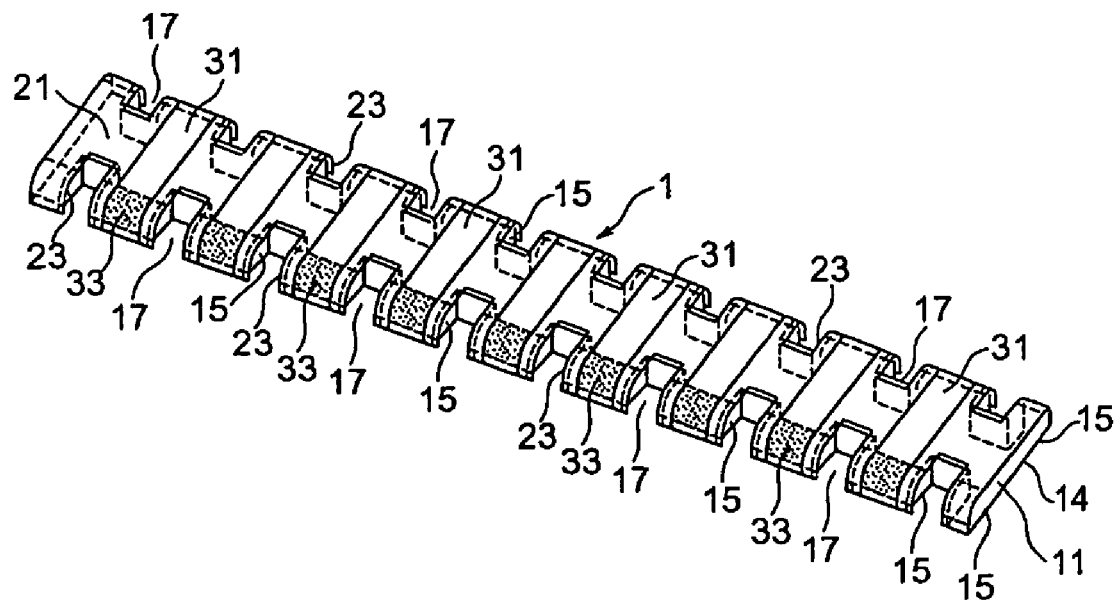
FIG. 3 is a perspective view of a connector element included in the connector of FIG. 1.

Referring to FIGS. 1 to 3, a description will be given of a connector according to a first exemplary embodiment of this invention.

The illustrated connector includes a connector element 1 comprising an elastic body 11, an insulating sheet member 21 disposed on the elastic body 11, and conductive layers 31 disposed on the sheet member 21 at predetermined positions at a predetermined pitch. The elastic body 11 has a base portion 12 having a rectangular prism shape and a plurality of finger pieces or protruding portions 15 protruding in opposite directions from both surfaces, in a width direction perpendicular to a longitudinal direction (pitch direction), of the base portion 12, respectively. Herein, it can also be said that the protruding portions 15 are arranged along opposite sides, extending in the longitudinal direction, of the base portion 12. The base portion 12 has a holding surface 13 holding the sheet member 21 with the conductive layers 31 disposed thereon, and a flat base surface 14 opposite to the holding surface 13.

Each of the protruding portions 15 of the elastic body 11 has a flat protruding base surface 14a extending in the width direction from the base surface 14, a curved surface 15a formed in a generally circular-arc shape extending from the holding surface 13 toward a side of the protruding base surface 14a, and a side surface 15b extending from the curved surface 15a in a direction perpendicular to the protruding base surface 14a so as to connect the curved surface 15a and the protruding base surface 14a to each other. The elastic body 11 is formed with a plurality of grooves 17. With the formation of the grooves 17, the elastic body 11 has the grooves 17 and the protruding portions 15 that are alternately arranged in the longitudinal direction. The grooves 17 serve as relief spaces for the elastic body 11 when the elastic body 11 is compressed and deformed in the width direction. That is, with the formation of the grooves 17 on the elastic body 11 in the longitudinal direction so as to match the predetermined pitch of the conductive layers 31, the deformability in a certain load state is improved.

Since the concave-convex shape is formed in the longitudinal direction by the protruding portions 15 and the grooves 17, the elastic body 11 has high deformability. It is possible to easily change the deformability by changing the width shape of the grooves 17.

The sheet member 21 is held on the elastic body 11 so as to cover the holding surface 13 of the elastic body 11 and the curved surfaces 15a and the side surfaces 15b of the protruding portions 15. The conductive layers 31 are arranged on the surface of the sheet member 21 at intervals of the predetermined pitch in a longitudinal direction of the sheet member 21. Further, the conductive layers 31 are arranged as strip-like wiring patterns each extending in a width direction perpendicular to the longitudinal direction of the sheet member 21. That is, each conductive layer 31 serves as a wiring pattern that is located corresponding, via the sheet member 21, to the pair of protruding portions 15 in the width direction and to the holding surface 13 between such a pair of protruding portions 15.

The sheet member 21 is formed with a plurality of cutouts 23 by cutting portions thereof facing the grooves 17 of the elastic body 11. The cutouts 23 serve as portions for freeing the grooves 17 when the sheet member 21 is held on the holding surface 13 of the elastic body 11 and the curved surfaces 15a and the side surfaces 15b of the protruding portions 15. By forming the cutouts 23 in the sheet member 21, it is possible to allow the elastic body 11 to have independence for its deformation.

When electrically connecting a connection object 61 or a mating connection object 71, shown in FIG. 2, by the use of the connector element 1, it is possible to achieve connection stability at the level of the conductive layers 31 with respect to distortion or warping of the connection object 61 or the mating connection object 71 and slight differences in height of the conductive layers 31. The cutouts 23 can be formed by cutting the sheet member 21 between the conductive layers 31 by a method such as laser machining or press machining.

Referring back to FIG. 1, the connector element 1 is placed and held in a housing 51 as a frame, thereby forming the connector. The housing 51 is formed with a holding hole 52 extending in a longitudinal direction thereof. The connector element 1 is held by the housing 51 such that the base portion 12 and the sheet member 21 and the conductive layers 31 on the base portion 12 are press-fitted into the holding hole 52. By cutting the connector element 1 in its width direction so as to match the longitudinal dimension of the holding hole 52, the connector element 1 having a desired dimension can be held in the holding hole 52.

The conductive layers 31 on the protruding portions 15 on one side in the width direction of the connector element 1 are brought into contact with a contact portion 62 of the connection object 61 as a printed wiring board shown in FIG. 2. On the other hand, the conductive layers 31 on the protruding portions 15 on the other side are brought into contact with a contact portion 72 of the mating connection object 71 as an electronic device. That is, the connection object 61 and the mating connection object 71 are connected to each other through the conductive layers 31 as the wiring patterns each extending in the width direction.

The connector element 1 is held in the holding hole 52 of the housing 51 so as to match the layout of the connection object 61 and the mating connection object 71 and the number of contacts at the contact portion 62 of the connection object 61 and at the contact portion 72 of the mating connection object 71.

Accordingly, the connector has high versatility and is excellent in mass productivity. For example, in the case where the contact portion 62 of the connection object 61 and the contact portion 72 of the mating connection object 71 are each in the form of 20 contacts×4 rows, a technique is possible in which a connector with 100 contacts is divided into 5 pieces and press-fitted into the housing 51.

Each conductive layer 31 has a plurality of projections 33 projecting outward from the surface thereof. The projections 33 are disposed on the surface of the conductive layer 31 on the sheet member 21 facing part of the curved surface 15a near the side surface 15b of each protruding portion 15 and facing the side surface 15b of each protruding portion 15. The projections 33 can be formed when forming the conductive layer 31 by plating. When forming the conductive layer 31 on the sheet member 21 by plating, the projections 33 are each formed into a circular cone shape with their tapered tips oriented outward of the surface of the conductive layer 31, thereby obtaining the tapered projections 33. The projection 33 is not necessarily formed into the circular cone shape, but may have any shape as long as it can project from the surface of the conductive layer 31, such as a spherical shape, a polygonal shape, or a concave-convex shape.

In the case where the projection 33 is formed into the circular cone shape, it does not easily come off the surface of the conductive layer 31. When the thickness of the conductive layer 31 is set to 30 μm or less, the height of the projection 33 from the surface of the conductive layer 31 is preferably 10 μm to 30 μm.

In this exemplary embodiment, as means for forming the projections 33 on the conductive layer 31, a plurality of particles 35 for forming the projections 33 are disposed in the conductive layer 31 as shown in FIG. 2. The particles 35 are metal particles harder than the conductive layer 31. The conductive layer 31 can be fixedly formed on the surface of the sheet member 21 by plating and, by forming the particles 35 into a circular cone shape with their tapered tips oriented toward the surface of the conductive layer 31, the tapered projections 33 can be formed. The particle 35 is not necessarily formed into the circular cone shape, but may have any shape as long as it can form the projection 33 into a spherical shape, a polygonal shape, a concave-convex shape, or the like.

In the case where the projection 33 is formed into the circular cone shape, it does not easily come off the surface of the conductive layer 31. When the thickness of the conductive layer 31 containing the particles 35 is set to 30 μm or less, the height of the projection 33 from the surface of the conductive layer 31 is preferably 10 μm to 30 μm.

Hereinbelow, a description will be given of an operation of connecting the connection object 61 and the mating connection object 71 to each other by the use of the connector.

In the state where the connector element 1 is inserted and held in the housing 51 as shown in FIGS. 1 and 2, the connector element 1 is sandwiched in the width direction between the connection object 61 and the mating connection object 71. The connection object 61 and the mating connection object 71 are connected to each other by applying a load to the connector element 1 in the width direction.

Figure 4:
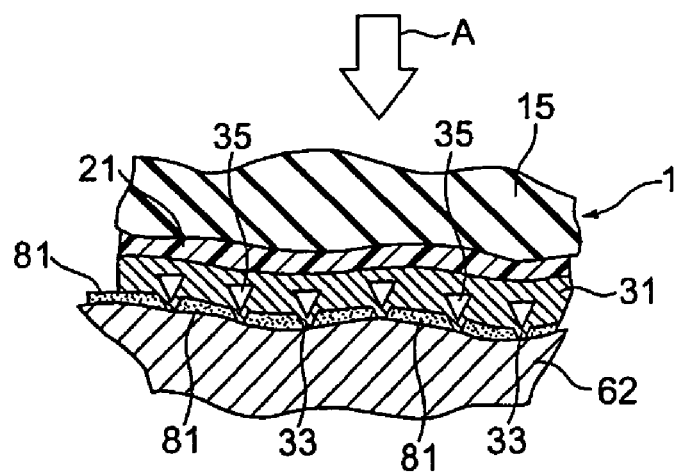
FIG. 4 is an enlarged sectional view of only a main part showing a connection state between the connector shown in FIGS. 1 and 2 and a connection object.

FIG. 4 enlargedly shows the state where the contact portion 62 of the connection object 61 and the conductive layer 31 on the lower-side protruding portion 15 of the connector element 1 are in contact with each other. In FIG. 4, there is shown an example in which the contact portion 62 of the connection object 61 is covered with a contamination layer 81 such as oil. Further, a description will be given using the connection element 1 having the particles 35 in the conductive layers 31.

Referring to FIG. 4, the connector element 1 applied with a load in the width direction by the connection object 61 and the mating connection object 71 applies an elastic force of the protruding portion 15 to the contact portion 62 of the connection object 61 as indicated by an arrow A. Since the protruding portion 15 is elastically deformed, the projections 33 apply a load while slightly changing their positions in a direction parallel to the surface of the contact portion 62.

In this event, since the projections 33 of the conductive layer 31 are brought into contact with the contact portion 62 of the connection object 61 by pushing aside the contamination layer 81 with the elastic force of the protruding portion 15, multipoint connection with the contact portion 62 is enabled by the projections 33.

As shown in FIG. 4, when observing the magnified surface of the contact portion 62, it is not a surface like a mirror surface, but a concave-convex surface or a corrugated surface. However, since the thickness of the sheet member 21 and the conductive layer 31 is about several tens of micrometers, when the elastic force of the protruding portion 15 is applied to the contact portion 62, the sheet member 21 and the conductive layer 31 follow the surface of the contact portion 62 so as to be deformed.

Therefore, even in an environment where the contact portion 62 of the connection object 61 or the contact portion 72 of the mating connection object 71 is covered with the contamination layer 81 or an environment where foreign matter adheres to the contact portion 62 or 72, the projections 33 can push aside the contamination layer 81 or the foreign matter by the elastic force of the protruding portions 15 so as to be brought into contact with the contact portion 62 or 72 with low contact pressure.

Figure 5:
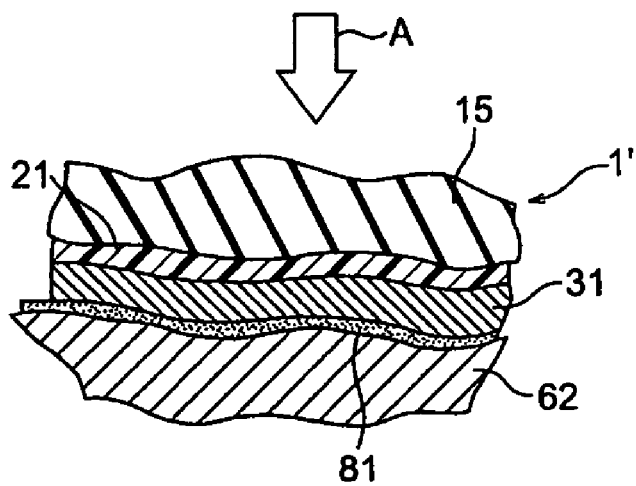
FIG. 5 is an enlarged sectional view of only a main part showing a connection state between a connector as a comparative example and a connection object.

FIG. 5 shows an example in which the conductive layers 31 of the connector element 1 shown in FIG. 4 have no projections 33. In FIG. 5, a connector element 1' applied with a load by a connection object 61 and a mating connection object 71 applies an elastic force of a protruding portion 15 to a contact portion 62 of the connection object 61 as indicated by an arrow A. In this event, since a contamination layer 81 is present, those portions where a conductive layer 31 is brought into contact with the contact portion 62 of the connection object 61 are reduced, so that connection with the contact portion 62 becomes unstable.

Figure 6:
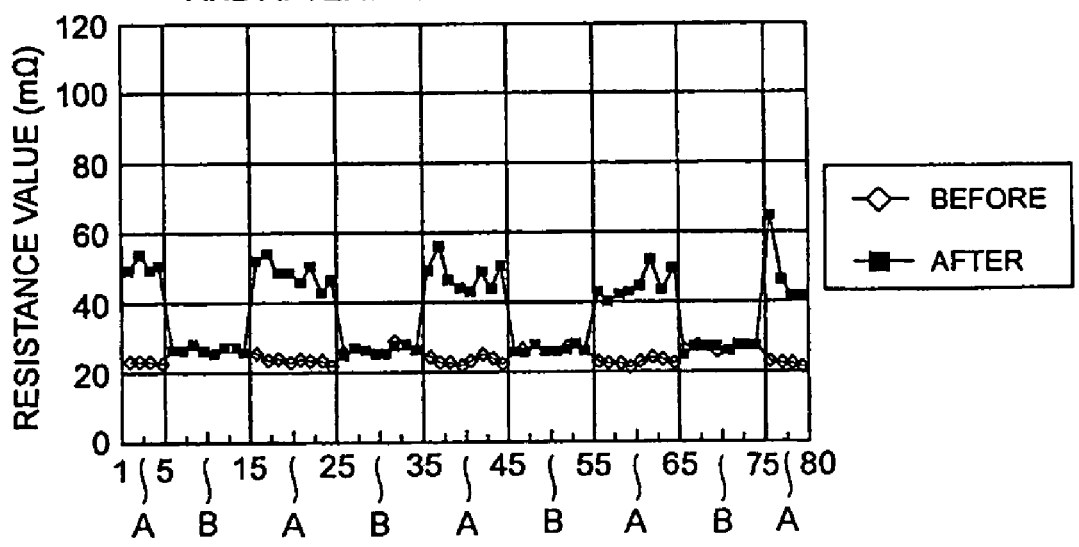
FIG. 6 is a graph showing resistance value changes before and after application of oil in the connectors of FIGS. 4 and 5.

FIG. 6 shows the results of measuring resistance values (mΩ) before and after application of oil (contamination layer 81) at terminals (terminal numbers), as individual samples, of the connector element 1 shown in FIG. 4 and the connector element 1' shown in FIG. 5. In FIG. 6, symbol A represents the connector element 1' and symbol B represents the connector element 1. The results were obtained using, at first, 5 contacts with no projections and, thereafter, alternately using 10 contacts with projections and 10 contacts with no projections.

As is clear from FIG. 6, it is seen that resistance value changes before and after the application of oil (contamination layer 81) are large in the case of the connector element 1' having no projections 33, while, there is almost no change in the case of the connector element 1 having the projections 33.

The elastic body 11 can be formed using a method such as molding. The conductive layers 31 are obtained by patterning a metal thin film on the sheet member 21. In this event, the conductive layers 31 are disposed at positions corresponding to the protruding portions 15 and the holding surface 13 between the protruding portions.

The metal thin film can be deposited and patterned on the sheet member 21 on the order of several micrometers by the use of a microfabrication technique such as plating, metal deposition, and etching. Further, the conductive layers 31 can be arranged at intervals of 0.5 mm or less in the longitudinal direction of the sheet member 21, so that narrowing of pitch is enabled. As the sheet member 21, an FPC (Flexible Printed Circuit) may be employed.

The sheet member 21 is fixedly bonded to the holding surface 13 of the elastic body 11 so as to follow the holding surface 13. As a material of the elastic body 11, it is preferable to use a rubber, mainly a silicon-based rubber, having heat resistance. The elastic body 11 may be made of a gel material.

The elastic body 11 and the sheet member 21 can be bonded together by application of an adhesive or a coupling agent. Bonding between the elastic body 11 and the sheet member 21 can also be realized by thermal welding. As the sheet member 21, a kind of resin film made of a polyimide resin or an aramid resin may be used.

Figure 7:
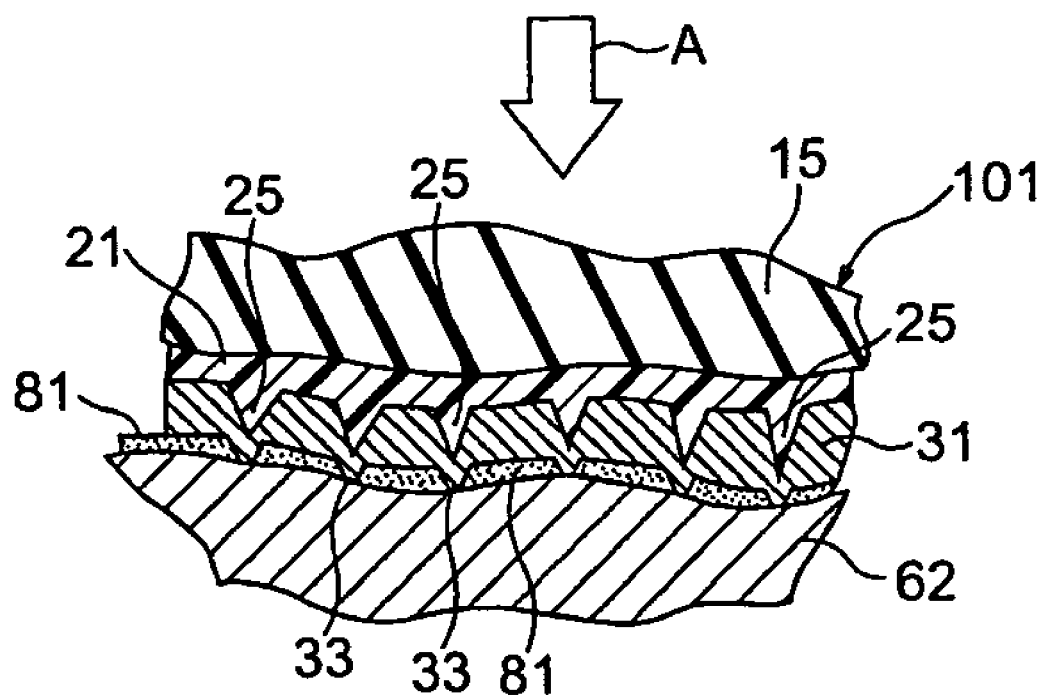
FIG. 7 is an enlarged sectional view of only a main part showing a connection state between a connector according to a second exemplary embodiment of this invention and a connection object.

Referring to FIG. 7, a description will be given of a connector according to a second exemplary embodiment of this invention. Similar portions are designated by like reference numerals or symbols and omitted with the explanation thereof.

FIG. 7 enlargedly shows the state where a conductive layer 31 on a lower-side protruding portion 15 of a connector element 101 is in contact with a contact portion 62 of a connection object 61. In FIG. 7, there is shown an example in which the contact portion 62 of the connection object 61 is covered with a contamination layer 81 such as oil like in the case of the connection between the contact portion 62 of the connection object 61 and the connector element 1 shown in FIG. 4.

The connector element 101 comprises an elastic body 11, a sheet member 21 disposed on the elastic body 11, and conductive layers 31 disposed on the sheet member 21 at predetermined positions at a predetermined pitch. The sheet member 21 is formed with projections 25 projecting outward from the surface thereof. When forming the sheet member 21, the projections 25 are each integrally formed into a circular cone shape with their tapered tips oriented outward of the surface of the sheet member 21, thereby obtaining the tapered projections 25. In the case where separate projections 25 are fixed to the sheet member 21, if the projections 25 are each formed into a circular cone shape, the projections 25 do not easily come off the surface of the sheet member 21. When the thickness of the conductive layer 31 is set to 30 μm or less, the height of the projection 25 from the surface of the sheet member 21 is preferably 10 μm to 30 μm. Like the projection 33 formed on the conductive layer 31 in the first exemplary embodiment, the projection 25 is not necessarily limited to the circular cone shape.

By disposing the conductive layers 31 in the form of thin film conductors by plating on a surface, where the projections 25 are formed, of the sheet member 21, projections 33 of the conductive layers 31 can be formed.

In the state where the connector element 101 is inserted and held in a housing 51 as shown in FIGS. 1 and 2, the connector element 101 is sandwiched in the width direction between the connection object 61 and the mating connection object 71 and, by applying a load to the connection object 61 and the mating connection object 71, the connection object 61 and the mating connection object 71 are connected to each other through the connector element 101.

Referring to FIG. 7, the connector element 101 applied with a load by the connection object 61 and the mating connection object 71 applies an elastic force of the protruding portion 15 to the contact portion 62 of the connection object 61 as indicated by an arrow A. In this event, since the projections 33 of the conductive layer 31 on the projections 25 of the sheet member 21 are brought into contact with the contact portion 62 of the connection object 61 by pushing aside the contamination layer 81 with the elastic force of the protruding portion 15, multipoint connection with the contact portion 62 is enabled by the projections 33 on the projections 25.

Therefore, even in an environment where the contact portion 62 of the connection object 61 or the contact portion 72 of the mating connection object 71 is covered with the contamination layer 81 or an environment where foreign matter adheres to the contact portion 62 or 72, the projections 33 of the conductive layers 31 can push aside the contamination layer 81 or the foreign matter by the elastic force of the protruding portions 15 so as to be brought into contact with the contact portion 62 or 72 with low contact pressure.

Although the description has been given of the elastic body 11 having the base portion 12 and the grooves 17 and the sheet member 21 having the cutouts 23, this invention is also applicable to a connector in which a sheet member 21 having not cutouts 23 is bonded to an elastic body 11 having no grooves 17.

Further, each conductive layer 31 may comprise a first layer in the form of a nickel composite plating layer having a hard concave-convex surface with hard particles, a second layer in the form of a nickel plating layer containing no hard particles and formed on the first layer, and a third layer in the form of a tin or gold plating layer formed on the second layer.

The foregoing connector can be used as an electrical connection connector for use in connection between an IC chip, a flexible printed wiring board, or the like and a wiring board, a subcarrier, or the like, a connector for an LGA (Land Grid Array) chip, or a connector for a BGA (Ball Grid Array) chip.

Since the foregoing connector has the projections on the conductive layers or on the conductive layers and the sheet member, even in an environment where a contact portion of a connection object or a contact portion of a mating connection object is covered with a contamination layer such as oil or an environment where foreign matter such as dust or particles adhere to the contact portion, the projections push aside the contamination layer or the foreign matter by the elastic force of the protruding portions so as to be brought into contact with the contact portion with low contact pressure, so that it is possible to ensure sufficient connection reliability.

Further, since the foregoing connector has the granular projections on the low-rigidity conductive layers, the projections can be brought into contact with a contact portion of a connection object or a mating connection object at multiple points with a low load (e.g. 0.05 N). Specifically, the connector is connectable with a low contact pressure of 10 g or less per contact and, even in the case of 5,000 contacts, enables sufficiently good electrical connection with a load of 500 N.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A connector adapted to achieve electrical connection by contact with a connection object, the connector comprising:
    a body portion comprising an elastic body and a flexible film which extends along a surface of the elastic body;
    a conductive layer extending along a surface of the flexible film and adapted for contact with the connection object; and
    a plurality of particles dispersed in the conductive layer, wherein the particles partially raise the conductive layer outward to make the conductive layer have a plurality of projections projecting outward.

2. The connector according to claim 1, wherein the body portion has a plurality of finger pieces spaced apart from each other and the conductive layer is disposed corresponding to each of the finger pieces.

3. The connector according to claim 2, wherein the finger pieces are arranged along mutually opposite two sides of the body portion and the conductive layer extends between the two sides so as to correspond to the finger pieces.

4. The connector according to claim 1, wherein the flexible film has a plurality of projecting portions projecting toward the conductive layer and the projecting portions partially raise the conductive layer outward to further form the projections, respectively.

5. The connector according to claim 1, wherein the projections each have a height of 10 μm or more.

6. The connector according to claim 1, wherein the projections each have a tapered shape tapering in a projecting direction.

7. The connector according to claim 3, wherein the body portion comprises a base portion located in the middle between the two sides and the finger pieces protrude in mutually opposite directions from the base portion.

8. The connector according to claim 7, further comprising a housing receiving therein the base portion, wherein the finger pieces are exposed to the outside from the housing.

9. The connector according to claim 3, wherein the projections are provided at portions, corresponding to the finger pieces, of the conductive layer.

10. The connector according to claim 9, wherein the projections are located at the two sides.

* * * * *